US009743167B2

(12) United States Patent
Nielsen et al.

(10) Patent No.: US 9,743,167 B2
(45) Date of Patent: Aug. 22, 2017

(54) MICROPHONE WITH SOFT CLIPPING CIRCUIT

(71) Applicant: Knowles Electronics, LLC, Itasca, IL (US)

(72) Inventors: John Nielsen, Hillerod (DK); Selvakumar Sivarajah, Pulau Pinang (MY); Aziz Yurrtas, Copenhagen (DE)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/950,568

(22) Filed: Nov. 24, 2015

(65) Prior Publication Data

US 2016/0182988 A1 Jun. 23, 2016

Related U.S. Application Data

(60) Provisional application No. 62/093,138, filed on Dec. 17, 2014.

(51) Int. Cl.

| | |
|---|---|
| ***H04R 1/04*** | (2006.01) |
| ***B81B 7/00*** | (2006.01) |
| ***B81B 7/02*** | (2006.01) |
| ***H04R 1/22*** | (2006.01) |
| ***H04R 3/00*** | (2006.01) |
| ***H04R 19/01*** | (2006.01) |

(52) U.S. Cl.

CPC ............... *H04R 1/04* (2013.01); *B81B 7/008* (2013.01); *B81B 7/02* (2013.01); *H04R 1/222* (2013.01); *H04R 3/007* (2013.01); *H04R 19/016* (2013.01); *H04R 2201/003* (2013.01); *H04R 2499/11* (2013.01)

(58) Field of Classification Search

CPC .......... H04R 1/04; H04R 1/222; H04R 3/007; H04R 2201/003; B81B 7/008; B81B 7/02

USPC .................................................. 381/116, 107

See application file for complete search history.

(56) References Cited

U.S. PATENT DOCUMENTS

| | | | |
|---|---|---|---|
| 7,190,038 | B2 | 3/2007 | Dehe et al. |
| 7,473,572 | B2 | 1/2009 | Dehe et al. |
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,856,804 | B2 | 12/2010 | Laming et al. |
| 7,903,831 | B2 | 3/2011 | Song |

(Continued)

FOREIGN PATENT DOCUMENTS

JP 2012-090224 A 5/2012

OTHER PUBLICATIONS

International Search Report and Written Opinion, PCT/US2015/063397, Knowles Electronics, LLC, 8 pages (Mar. 28, 2016).

(Continued)

*Primary Examiner* — David Ton

(74) *Attorney, Agent, or Firm* — Foley & Lardner LLP

(57) ABSTRACT

An apparatus includes a microelectromechanical system (MEMS) device having a diaphragm and a back plate; a clipping circuit coupled to the MEMS device, wherein the clipping circuit is configured to clip an output signal of the MEMS device so that the maximum signal drawn by a buffer is substantially constant over a temperature range; and an integrated circuit coupled to the clipping circuit, the integrated circuit including the buffer.

20 Claims, 2 Drawing Sheets

Reference voltage
VR
202
D1
204
D2
V1
D3
206
214
V0
D4
208
Buffer
212
210
VC
200
222
214
224

(56) References Cited

U.S. PATENT DOCUMENTS

| | | | |
|---|---|---|---|
| 2005/0207605 | A1 | 9/2005 | Dehe et al. |
| 2007/0099327 | A1 | 5/2007 | Hartzell et al. |
| 2007/0278501 | A1 | 12/2007 | Macpherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0075875 | A1 | 3/2011 | Wu et al. |
| 2012/0269363 | A1 | 10/2012 | Suvanto |
| 2013/0266156 | A1 | 10/2013 | Frohlich et al. |
| 2014/0091406 | A1 | 4/2014 | Harney et al. |

OTHER PUBLICATIONS

English-language machine translation of JP 2012-090224, Panasonic Corp. (May 10, 2012).

MICROPHONE WITH SOFT CLIPPING CIRCUIT

CROSS-REFERENCE TO RELATED APPLICATION

This application claims the benefit of U.S. Provisional Patent Application Ser. No. 62/093,138, filed Dec. 17, 2014, entitled MICROPHONE WITH SOFT CLIPPING CIRCUIT which is incorporated by reference in its entirety herein.

FIELD OF THE INVENTION

This application relates to microphones, and more specifically to clipping circuits used within these microphones.

BACKGROUND OF THE INVENTION

Microphones are typically constructed of two main components: Micro-Electro-Mechanical System (MEMS) devices that receive and convert incoming sound into electrical signals, and Application Specific Integrated Circuits (ASICs) that take the electrical signal from the MEMS device and perform post processing on the signal and/or buffering the signal for the following circuit stages in a larger electronic environment. The following circuit stages may be disposed in cellular phones, personal computers, or tablets to mention a few examples.

However, these previous microphones have limits as to how much signal the microphone can take before distorting the incoming signal. These distortions come from both the MEMS device and the ASIC and they are typically independent of each other.

Signal distortion in the ASIC generally happens when the input and/or the output electrical signal is too large a magnitude. A general way to control the input distortion is to have a circuit to clamp/soft clip the signal. This is to ensure that the signal will not be distorted in an abrupt and undesirable way but in a controlled way.

Previous clipping circuits sometimes used diodes. However, the problem with these previous circuits was that the diode had a very large temperature coefficient. This caused different clipping points to occur at different temperature.

The problems of previous approaches have resulted in user dissatisfaction with these previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide a soft clipping circuit with temperature compensation. In one aspect, as temperatures vary the maximum signal drawn by a buffer in a microphone is constant or substantially constant. Because the maximum signal is constant, large signal distortion is also compensated and the problems associated with large signal distortion are avoided.

Figure 1:
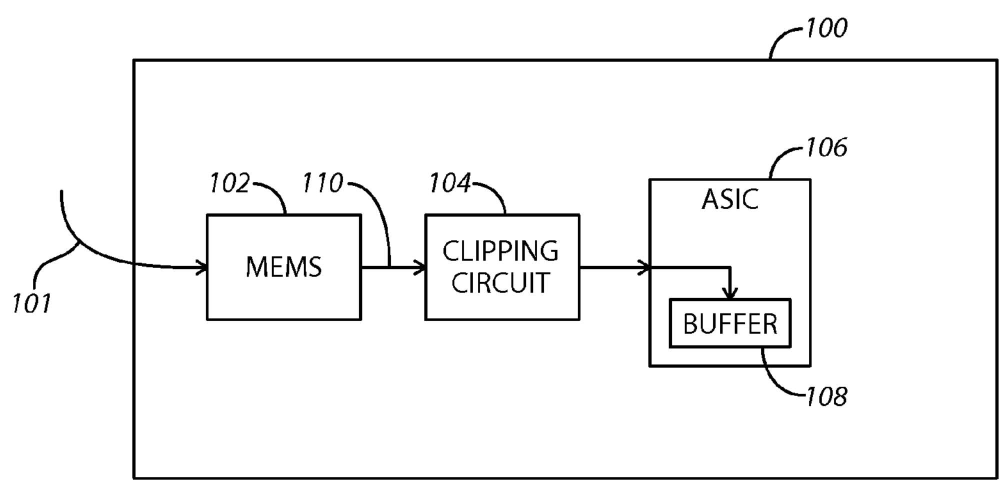
FIG. 1 comprises a block diagram of a microphone according to various embodiments of the present invention.

Referring now to FIG. 1, one example of a digital Microelectromechanical system (MEMS) microphone 100 is shown. The microphone 100 includes a MEMS device 102, a clipping circuit 104, and an application specific integrated circuit (ASIC) 106 (including a buffer 108). The ASIC 106 may include other circuit elements such as differential amplifiers, and analog-to-digital converters. Other examples of additional components are possible.

The MEMS device 102 is any type of MEMS microphone device that converts sound energy 101 into an analog electrical signal. The MEMS device 102 may also include a diaphragm and back plate that form a capacitance that varies with the acoustic energy received to produce an analog electrical signal. The analog electrical signal is fed to the buffer 104, which buffers the signal for later processing (by the ASIC 106, or other devices inside or outside the microphone 100).

The clipping circuit 104 performs a soft clipping on output signal 110 of the MEMS device 102 so that the maximum signal drawn by a buffer 108 is constant or substantially constant over a temperature range. Because the maximum signal is constant over a temperature range, large signal distortion is also compensated or the problems associated with large signal distortion are avoided. In one example, the clipping circuit 104 is disposed at the ASIC 106. In other examples, the clipping circuit 104 is a separate integrated circuit that is not disposed at the ASIC 106.

The buffer 108 holds data received from the ASIC 106. This data may be further processed by other functional elements at the ASIC 106.

Figure 2:
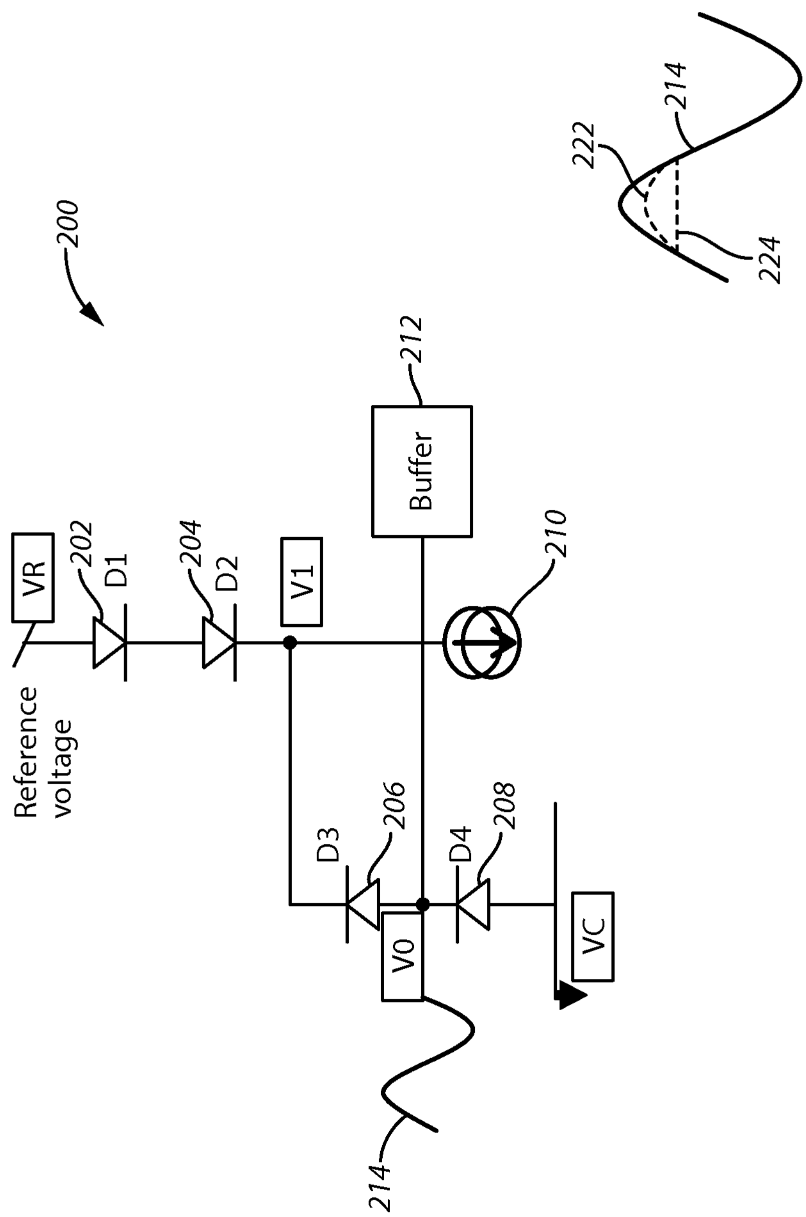
FIG. 2 comprises a block diagram of a clipping circuit used in a microphone according to various embodiments of the present invention.

Referring now to FIG. 2, one example of a clipping circuit 200 (in one example, the clipping circuit 104 of FIG. 1) is described. The circuit 200 includes a first diode 202 (D1), a second diode 204 (D2), a third diode 206 (D3), a fourth diode 208. The first diode 202 (D1) is coupled to a reference voltage (VR). V0 is coupled to the output of a MEMS device (e.g., the MEMS device 102 of FIG. 1). The fourth diode 208 (D4) is coupled to voltage VC, which is one example is connected to ground. The circuit 200 produces a constant current 210. V0 is also coupled to a buffer 212, which in one example is disposed on an ASIC.

In one example of the operation of the circuit 200, V1 is the resultant voltage of VR minus two forward bias voltage of a diode (e.g., diodes 202 and 204). The input signal 214 starts to clip when V0 is larger than V1 by a forward bias voltage of a diode. The input signal 214 also clips when V0 is smaller than VC by a forward bias voltage of a diode (e.g., diodes 202 and 204).

When the temperature of the circuit 200 varies, the forward bias voltage of diodes 206 (D3), 208 (D4) will also change, but this change in voltage across these diodes will be compensated for by the changing voltage V1. The voltage V1 changes because the forward bias voltage of the diodes 202 (D1), 204 (D2) matches the voltage changes occurring across the diodes 206 (D3), 208 (D4). In other words, the voltage changes of the voltage V1 will be same as the changes on the diodes 206 (D3), 208 (D4).

For example and at cold temperatures, the voltage across the diodes 206 (D3), 208 (D4) becomes larger. At the same time, the voltage V1 will move further away from VR by the same magnitude due to the changing voltages across the diodes 202 (D1), and 204 (D2).

If the soft-clipping point of the circuit 200 is temperature compensated, the maximum signal entering the buffer 212 will be constant (or substantially constant) across a temperature range and this is how the large signal distortion is compensated for in the present example. In other words, a large temperature swing will not affect (or will not substantially affect) the magnitude of the voltage being received by the buffer 212 and beneficial clipping will still be performed.

In one example, the input signal 214 is soft clipped by the circuit 200. As shown in FIG. 2, the magnitude of the top of the incoming sinusoidal waveform assumes the shape 222 so that the input signal is attenuated or modified in this portion of the waveform 214. In contrast, hard clipping refers to eliminating the top portion of the waveform as in the shape 224. The present approaches although preferably directed to soft clipping may in some instances be used with hard clipping and/or combinations of soft clipping and hard clipping.

It will be also appreciated that the circuit of FIG. 2 is one example of an approach whereby soft clipping with temperature compensation is performed. Other examples of circuit arrangements may include other circuit elements (e.g., additional diodes), or other circuit elements arranged in other configurations (e.g., additional diodes arranged in other configurations).

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An apparatus comprising:

a microelectromechanical system (MEMS) device having a diaphragm and a back plate;

a clipping circuit coupled to the MEMS device, wherein the clipping circuit is configured to clip an output signal of the MEMS device to generate a clipped signal, and wherein a maximum level of the clipped signal drawn by a buffer is substantially constant over a temperature range; and an integrated circuit coupled to the clipping circuit, the integrated circuit including the buffer.

2. The apparatus of claim 1, wherein the clipping circuit includes a plurality of diodes.

3. The apparatus of claim 2, wherein the plurality of diodes includes a first set of diodes and a second set of diodes, wherein the first set of diodes is coupled to a reference voltage, and wherein a first diode of the second set of diodes is coupled to an output of the MEMS device and a second diode of the second set of diodes is coupled to ground.

4. The apparatus of claim 1, wherein the clipping circuit is configured to clip the output signal when an output voltage of the MEMS device exceeds a forward bias voltage of a diode.

5. The apparatus of claim 1, wherein the clipping circuit is disposed on the integrated circuit.

6. The apparatus of claim 1, wherein the clipping circuit is separate from the integrated circuit.

7. The apparatus of claim 1, wherein the clipping circuit produces a constant current.

8. A microphone comprising:

a microelectromechanical system (MEMS) device having a diaphragm and a back plate, wherein the MEMS device is configured to convert sound energy into an electrical signal;

a clipping circuit coupled to the MEMS device, wherein the clipping circuit is configured to perform a soft clipping on the electrical signal from the MEMS device to generate a clipped signal, and wherein the clipping circuit is configured to compensate for a change of a soft-clipping point over a temperature range; and a buffer coupled to the clipping circuit, wherein the buffer is configured to buffer the clipped signal from the clipping circuit, and wherein a maximum level of the clipped signal received by the buffer is substantially constant over the temperature range.

9. The microphone of claim 8, wherein the clipping circuit includes a plurality of diodes.

10. The microphone of claim 9, wherein the plurality of diodes includes a first set of diodes and a second set of diodes, wherein the first set of diodes is coupled to a reference voltage, and wherein a first diode of the second set of diodes is coupled to an output of the MEMS device and a second diode of the second set of diodes is coupled to ground.

11. The microphone of claim 10, wherein the soft-clipping point includes a first soft-clipping point and a second soft-clipping point, wherein the first soft clipping point is a first voltage equal to the reference voltage minus a forward bias voltage of the first set of diodes and plus a forward bias voltage of first diode of the second set of diodes, and wherein the second clipping point is a second voltage equal to a negative value of a forward bias voltage of the second diode of the second set of diodes.

12. The microphone of claim 11, wherein the clipping circuit is configured to clip the electrical signal in response to a level of the electrical signal beyond a range between the first soft-clipping point and the second soft-clipping point.

13. The microphone of claim 8, wherein the clipping circuit and the buffer are disposed on an integrated circuit.

14. The microphone of claim 8, wherein the buffer is disposed on an integrated circuit, and wherein the clipping circuit is separate from the integrated circuit.

15. An integrated circuit comprising:

a clipping circuit configured to perform a soft clipping on an electrical signal output from a microelectromechanical system (MEMS) device to generate a clipped signal, wherein the clipping circuit is configured to compensate for a change of a soft-clipping point over a temperature range; and a buffer coupled to the clipping circuit and configured to buffer the clipped signal from the clipping circuit, wherein a maximum level of the clipped signal received by the buffer is substantially constant over the temperature range.

16. The integrated circuit of claim 15, wherein the clipping circuit includes a plurality of diodes.

17. The integrated circuit of claim 16, wherein the plurality of diodes includes a first set of diodes and a second set of diodes, wherein the first set of diodes is coupled to a reference voltage, and wherein a first diode of the second set of diodes is coupled to an output of the MEMS device and a second diode of the second set of diodes is coupled to ground.

18. The integrated circuit of claim 17, wherein the soft-clipping point includes a first soft-clipping point and a second soft-clipping point, wherein the first soft clipping point is a first voltage equal to the reference voltage minus a forward bias voltage of the first set of diodes and plus a forward bias voltage of first diode of the second set of diodes, and wherein the second clipping point is a second voltage equal to a negative value of a forward bias voltage of the second diode of the second set of diodes.

19. The integrated circuit of claim 18, wherein the clipping circuit is configured to clip the electrical signal in response to a level of the electrical signal beyond a range between the first soft-clipping point and the second soft-clipping point.

20. The integrated circuit of claim 15, further comprising processing circuits configured to process the clipped signal stored in the buffer.

* * * * *